United States Patent
Ullmann et al.

(10) Patent No.: US 10,348,304 B2
(45) Date of Patent: Jul. 9, 2019

(54) HIGH-VOLTAGE LEVEL-SHIFTER CIRCUITRY

(71) Applicant: Infineon Technologies AG, Neubiberg (DE)

(72) Inventors: Igor Ullmann, Villach (AT); Andreas Kalt, Treffen (AT); Franz Wachter, A-Sattendorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/714,446

(22) Filed: Sep. 25, 2017

(65) Prior Publication Data

US 2019/0097633 A1    Mar. 28, 2019

(51) Int. Cl.
| | |
|---|---|
| H03K 19/003 | (2006.01) |
| H03K 19/0185 | (2006.01) |
| H03K 19/00 | (2006.01) |
| H03K 3/356 | (2006.01) |
| H03K 19/0175 | (2006.01) |

(52) U.S. Cl.
CPC . *H03K 19/00384* (2013.01); *H03K 3/356104* (2013.01); *H03K 19/0013* (2013.01); *H03K 19/00315* (2013.01); *H03K 19/0175* (2013.01); *H03K 19/018521* (2013.01)

(58) Field of Classification Search
CPC ....... H03K 19/00384; H03K 19/00315; H03K 3/356104; H03K 19/018521; H03K 19/018528; H03K 19/0013; H03K 19/0175; G06F 3/00
See application file for complete search history.

(56) References Cited

U.S. PATENT DOCUMENTS

| | | | |
|---|---|---|---|
| 5,627,489 A | 5/1997 | Jochum | |
| 7,940,108 B1 | 5/2011 | Wang et al. | |
| 2003/0107425 A1* | 6/2003 | Yushan | H03K 17/063 |
| | | | 327/333 |
| 2005/0169027 A1 | 8/2005 | Bayer | |
| 2005/0285658 A1 | 12/2005 | Schulmeyer et al. | |
| 2010/0109744 A1 | 5/2010 | Czech et al. | |
| 2015/0303919 A1 | 10/2015 | Zhou et al. | |

FOREIGN PATENT DOCUMENTS

| | | |
|---|---|---|
| CN | 103166622 A | 6/2013 |
| EP | 2184853 A2 | 5/2010 |
| EP | 2804319 A1 | 11/2014 |
| JP | 2004363740 A | 12/2004 |

(Continued)

OTHER PUBLICATIONS

Seong, et al., "An Efficient High Voltage Level Shifter using Coupling Capacitor for a High Side Buck Converter," J Electr Eng Technol. 2015; 10: 1921-718.

(Continued)

*Primary Examiner* — Jung Kim
(74) *Attorney, Agent, or Firm* — Shumaker & Sieffert, P.A.

(57) ABSTRACT

High-voltage level-shifter architectures that provide galvanic coupling between low/high-voltage domains while simultaneously enabling high speed operation, low static current consumption and high reliability under a myriad of environmental circumstances including electromagnetic interference as well as process, voltage and temperature variations.

8 Claims, 8 Drawing Sheets

(56) References Cited

FOREIGN PATENT DOCUMENTS

WO    2009126930  A2    10/2009
WO    2013063570  A2    5/2013

OTHER PUBLICATIONS

Zeltner, et al., "Insulating IGBT Driver with PCB integrated capacitive coupling elements," CIPS 2010, Mar. 16-18, 2010, 6 pp.
Herzer, et al., "Integrated Gate Drvier Circuit Solutions," www.semikron.com, Issue 5, 2010 Power Electronics Europe, Mar. 2010, pp. 26-31.
Moghe, et al., "Nanosecond Delay Floating High Voltage Level Shifters in a 0.35 µm HV-CMOS Technology," IEEE Journal of Solid-State Circuits, vol. 46, No. 2, Feb. 2011, pp. 485-497.
Yunwu, et al., "A noise immunity improved level shift structure for a 600 V HVIC," Journal of Semiconductors, vol. 34, No. 6, Jun. 2013, pp. 065008-1-065008-5.
"Application Note AN-978," International Rectifier, accessed on Dec. 5, 2016, accsesed from www.irf.com, 30 pp.

* cited by examiner

HIGH-VOLTAGE LEVEL-SHIFTER CIRCUITRY

BACKGROUND

High-voltage level-shifters may be used in applications where so-called high-side gate drivers are configured to drive internal (on-chip) or external (off-chip) power transistors. As an example, high-voltage level-shifters may be used in automotive applications where the trend towards increasing battery voltages (e.g., 12V->48V) is apparent. As such, high-voltage level-shifters have significant importance in motor bridge, ignition and direct injection systems for example, as well as DC-DC convertor circuits and many other automotive and non-automotive applications.

SUMMARY

The present disclosure is directed to high-voltage level-shifter circuitry and methods that provide galvanic coupling between low-voltage and high-voltage domains while simultaneously enabling high speed operation, low static power consumption and high reliability under a myriad of environmental conditions including electromagnetic interference as well as process, voltage and temperature variations.

As an example implementation of the aspects of the present disclosure, a voltage level-shifter circuit may include or comprise latch circuitry configured to store an output bit that is a level-shifted version of an input bit, and charge amplifier circuitry configured to receive as input the input bit and, in response, to drive the latch circuitry to store the output bit that is the level-shifted version of the input bit.

As another example implementation of the aspects of the present disclosure, a voltage level-shifter circuit may include or comprise low-voltage domain circuitry that is configured to generate voltage input signals with reference to a low-voltage domain ground node, and high-voltage domain circuitry that is capacitively coupled to the low-voltage domain circuitry and that is configured to generate voltage output signals, with reference to a high-voltage domain common node, that correspond to a level-shifted version of the voltage input signals, wherein the high-voltage domain circuitry comprises charge amplifier circuitry and latch circuitry, and wherein the charge amplifier circuitry is configured to receive as input the voltage input signals and to drive the latch circuitry to generate the voltage output signals.

As another example implementation of the aspects of the present disclosure, a method may include or comprise, by charge amplifier circuitry of a voltage level-shifter circuit, receiving as input an input bit from low-voltage domain circuitry of the voltage level-shifter circuit and, in response, driving latch circuitry of the voltage level-shifter circuit to store an output bit that is a level-shifted version of the input bit.

As another example implementation of the aspects of the present disclosure, a voltage level-shifter circuit may include or comprise low-voltage domain circuitry that is configured to generate voltage input signals with reference to a low-voltage domain ground node, high-voltage domain circuitry that is capacitively coupled to the low-voltage domain circuitry and that is configured to generate voltage output signals, with reference to a high-voltage domain common node, that correspond to a level-shifted version of the voltage input signals, and correction control circuitry that is coupled in a feedback loop between the low-voltage domain circuitry and the high-voltage domain circuitry, wherein the high-voltage domain circuitry comprises charge amplifier circuitry that is configured to receive as input the voltage input signals and to drive the latch circuitry to generate the voltage output signals based on the voltage input signals, and wherein the correction control circuitry is configured to receive as input the voltage output signals and to drive the low-voltage domain circuitry to generate the voltage input signals based on the voltage output signals.

As another example implementation of the aspects of the present disclosure, a voltage level-shifter circuit may include or comprise latch circuitry configured to store an output bit that is a level-shifted version of an input bit, and feedback circuitry configured to restore the output bit to the level-shifted version of the input bit responsive to logic state change in the output bit absent logic state change in the input bit.

The details of one or more examples are set forth in the accompanying drawings and the description below. Other features, objects, and advantages will be apparent from the description and drawings, and from the claims.

DETAILED DESCRIPTION

Some high-voltage level-shifter (HVLSH) architectures may leverage two-stage or three-stage designs that include a first pseudo-differential stage with low-voltage (LV) components (e.g., supply/bias voltages<5V), from the core domain, a second stage with medium-voltage (MV) components (e.g., 5V<supply/bias voltages<12V), such as double-diffused isolation transistors (DMOS transistors) that operate at voltages above core voltage, and a third stage with high-voltage (HV) components (e.g., supply/bias voltages>12V) that operate at voltages even further above core voltage. In such architectures, the third stage is in general configured to reconstruct a signal bit that is received from the first stage and that in turn is fed into a high-side gate driver as a control signal.

Some HVLSH architectures may also leverage DC-coupled or galvanic-coupled signal paths to HV components via capacitive coupling, although transformer-based coupling is possible. When DC-coupling is used, HV DMOS transistors for example are taken as either isolation transistors or directly as high-side driving transistors. One disadvantage of such an architecture is relatively high power consumption due to non-zero static DC currents at both the LV and HV sides of the architecture. It is contemplated that the DC current flow can be avoided or minimized by design, although at a cost of substantially increased chip area requirements, using at least four DMOS transistors (e.g., two P-DMOS and two N-DMOS) as isolating devices and some additional circuitry.

Another disadvantage associated with DC-coupled level-shifter architectures is their inability to "drive downwards" or, equivalently, to shift towards negative voltage domains. This includes temporally short "under-voltage" states that might occur due to inductive behavior of wires and connections as well as permanent negative voltage shifts. From flexibility and efficiency perspectives, galvanic-coupled level-shifter architectures are more advantageous than DC-coupled level-shifter architectures However, a disadvantage for both DC-coupled or galvanic-coupled architectures lies in a more or less reduced robustness with respect to faulty switching and bit-flipping in the HV circuitry. This can be fatal in power applications, since large cross-currents in driven power transistors can thermally destroy a chip or the discrete switching element, or could lead to a safety critical event like inadvertent activation of a switching element which may be contrary to the provisions of various standards, such as ISO 26262. Such cross-currents should be avoided and/or quickly corrected to maintain the switching element at a safe operating point, although unwanted logic state changes in level-shifter circuitry as a whole should be avoided. Yet another disadvantage of some HVLSH architectures is that they do not support different voltage swings in the LV and HV domains, i.e., (VDDA−VSSA)≠(VDDB−VSSB). The high-voltage level-shifter circuitry and methods of present disclosure solve many of these and other issues that plague some HVLSH architectures.

In particular, the present disclosure is directed to high-voltage level-shifter circuitry and methods that provide galvanic coupling between LV and HV domains while simultaneously enabling high speed operation, low static power consumption and high reliability under a myriad of environmental conditions including electromagnetic interference (EMI) as well as process, voltage and temperature (PVT) variations. As such, the features or aspects of the present disclosure, not merely limited to the implementation-specific examples discussed throughout, solve many of the issues that plague some HVLSH architectures, and do so in an efficient and cost-friendly manner realized in part due to the limited usage of high voltage devices (e.g., DMOS transistors).

Figure 1:
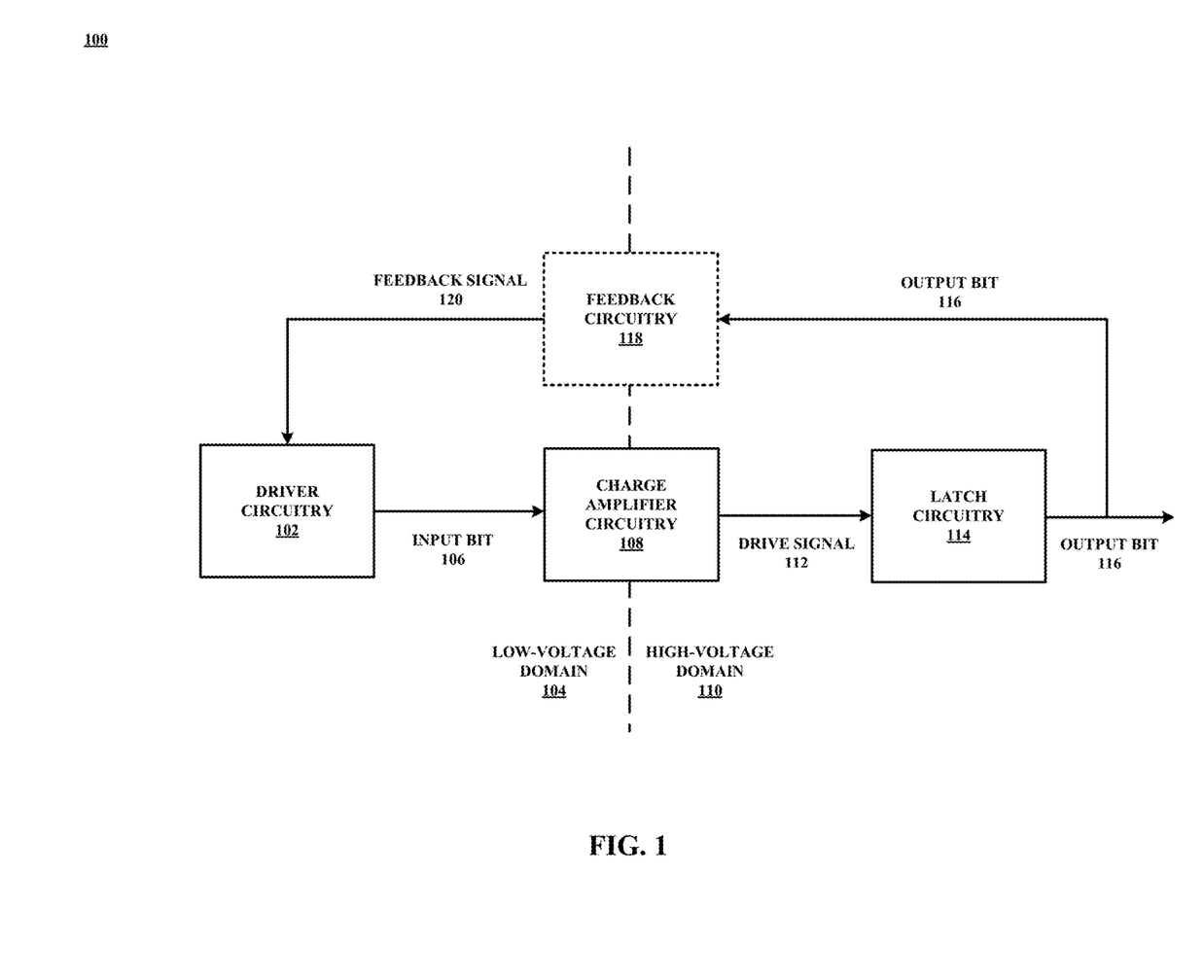
FIG. 1 shows a block diagram of level-shifter circuitry according to the disclosure.

For example, the features or aspects of the present disclosure may confer the following advantages: increased area and power efficiencies (e.g., ~0.005 μm$^2$ in 120 nm power technology, ~1 nA DC current); fast switching speeds (e.g., ~10-20 nanoseconds or better); no need for DMOS transistors that introduce parasitic elements like thyristors, diodes, and capacitances; robustness against data loss, fast switching transients, and EMI; and supports different voltage swings in the LV and HV domains. FIG. 1 shows a block diagram of level-shifter circuitry 100 according to the disclosure and in which such mentioned and other advantages may be realized.

In the example of FIG. 1, driver circuitry 102 of low-voltage domain 104 is configured to generate an input bit 106. In turn, charge amplifier circuitry 108 is configured to receive input bit 106 and, in response, to generate drive signal 112 to drive latch circuitry 114 of high-voltage domain 110 to store and provide output bit 116 that is a level-shifted version of input bit 106. For example, output bit 116 may exhibit a voltage level of 48V (e.g., logic 1=48V, with reference to a common node of high-voltage domain 110) while input bit 106 may exhibit a voltage level of 5V (e.g., logic 1=5V, with reference to a common node of low-voltage domain 104). Thus, input bit 106 and output bit 116 may encode the same information as either logic 1 or logic 0 at any particular moment in time as intended, but the voltage level of input bit 106 is in general less than or at least different than voltage level of output bit 116. In this manner, output bit 116 is a level-shifted version of input bit 106 and, advantageously, charge amplifier circuitry 108 may be configured to enable level-shifter circuitry 100 to realize at least some of the advantages as itemized above with references to the features or aspects of the present disclosure.

In particular, and as discussed in more detail below, charge amplifier circuitry 108 is configured such that only the change or transition of input bit 106 is processed in high-voltage domain 110. As such, level-shifter circuitry 100 is substantially less prone to EMI and PVT variations as compared to some HVLSH architectures. However, a common mode error signal for example may still propagate from low-voltage domain 104 to high-voltage domain 110 and corrupt output bit 116. Accordingly, it is contemplated that level-shifter circuitry 100 may further include feedback circuitry 118 (but not necessarily, as indicated by intermittent line in FIG. 1) that is configured, to receive output bit 116 or at least a signal that is derived from output bit 116 and, in response, to generate feedback signal 120 that is provided as input to driver circuitry 102 in order to correct or mitigate impact of a common mode error signal, also discussed in more detail below.

Figure 2:
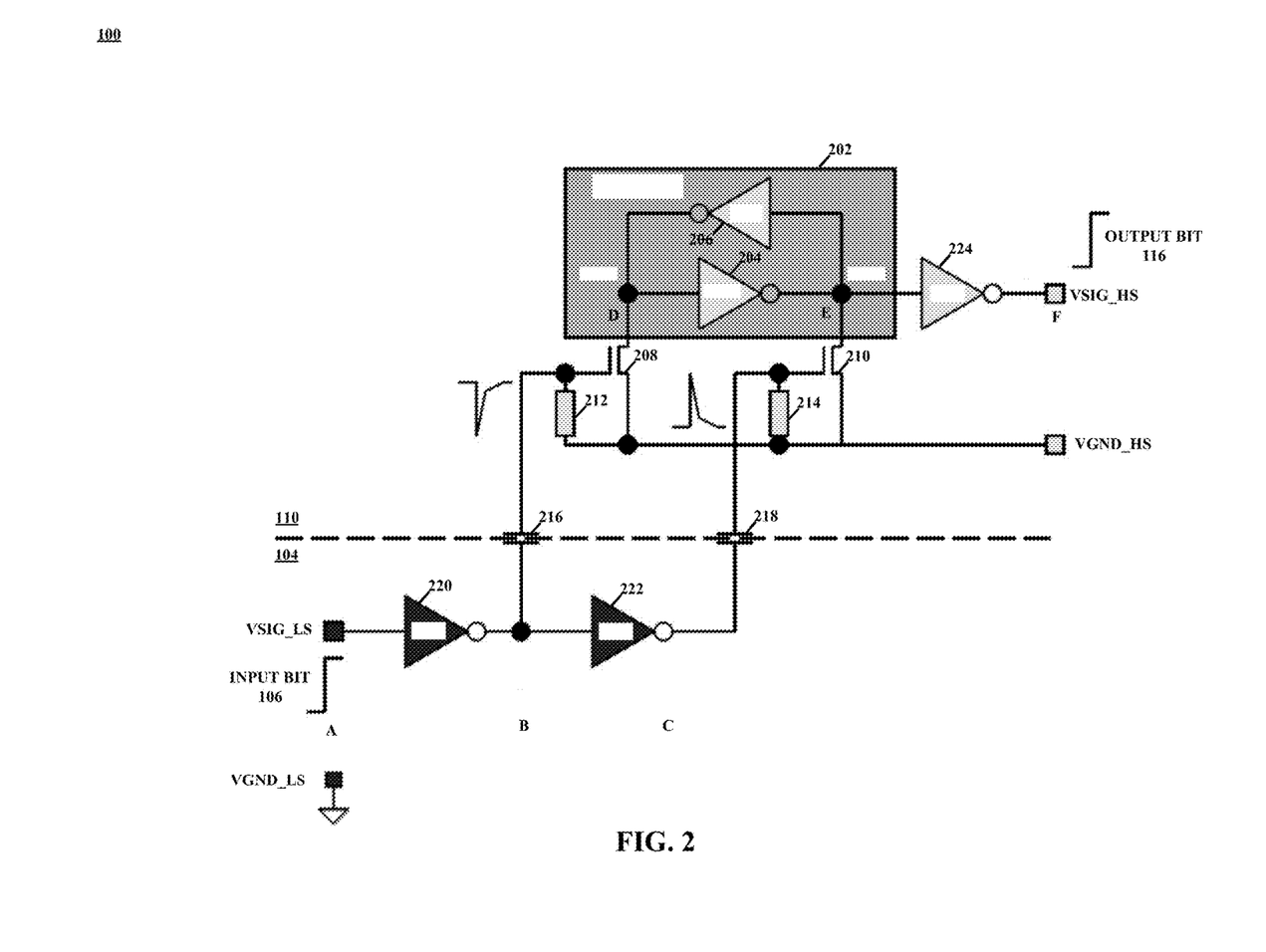
FIG. 2 shows aspects of the circuitry of FIG. 1 in first example detail.

FIG. 2 shows aspects of level-shifter circuitry 100 of FIG. 1 in first example detail. In particular, level-shifter circuitry 100 as depicted in FIG. 2 includes an HV latch 202 formed by ring-coupled inverters 204 and 206. In practice, the two inputs/outputs of HV latch 202 (labeled nodes D and E in FIG. 2) are driven by the drains of transistors 208 and 210, which in this example correspond to LV or MV n-channel power transistors. Although, each one of transistors 208 and 210 may correspond to p-channel power transistors wherein respective resistors 212 and 214 would be connected to VDD_HS (high-side power rail, see FIG. 3) instead of VGND_HS (high-side common node) as shown in FIG. 2. One of ordinary skill in the art would understand that a combination of n-channel and p-channel transistors may be used as well, and also that BJT transistors or any other type of transistor could be used instead of or in addition to power MOSFETs or other type of field-effect transistor in accordance with implementation-specific requirements.

In FIG. 2, low-voltage domain 104 and high-voltage domain 110 are, from input signal (input bit 106) perspective, crossed via at least two capacitors 216 and 218 that may be realized as HV capacitors of metal-metal type, for instance, but it is contemplated that any device (passive or active) that exhibits a desired capacitance may be leveraged in this capacity. Also, from input signal perspective, the combination of resistor 212 and capacitor 216, and the combination of resistor 214 and capacitor 210, forms a high-pass filter structure so that only the change or transition of input bit 106 is processed in high-voltage domain 110. In practice, input bit 106 is but a single bit in a train of bits or pulses that corresponds to an input signal that is generated by driver circuitry 102 (see FIG. 1).

For a high-to-low transition of input bit 106, the combination of capacitor 216, resistor 212 and transistor 208 acts as a charge amplifier for the two inputs % outputs of HV latch 202, where the output of inverter 220 (labeled node B in FIG. 2) of driver circuitry 102 (see FIG. 1) is directly coupled to capacitor 216. One of ordinary skill in the art would understand the principle of operation of a charge amplifier and so for sake of brevity such a description is not provided here. For a low-to-high transition of input bit 106 as shown in FIG. 2, the combination of capacitor 218, resistor 214 and transistor 210 acts as a charge amplifier for the two inputs/outputs of HV latch 202, where the output of inverter 222 (labeled node C in FIG. 2) of driver circuitry 102 is directly coupled to capacitor 218. Level-shifter circuitry 100 as shown in FIG. 2 is less prone to PVT variances because charges from driver circuitry 102 are actively amplified through transistors 208 and 210 of charge amplifier circuitry 108 (see FIG. 1). This increases reliability of the signal path towards a buffer or inverter 224 of level-shifter circuitry 100, where a gate driver for a power transistor receives output bit 116 as input, in order to avoid large cross-currents in driven power transistors that as mentioned above can thermally destroy a chip or the discrete switching element, or lead to a safety critical event like inadvertent activation of a switching element.

Figure 3:
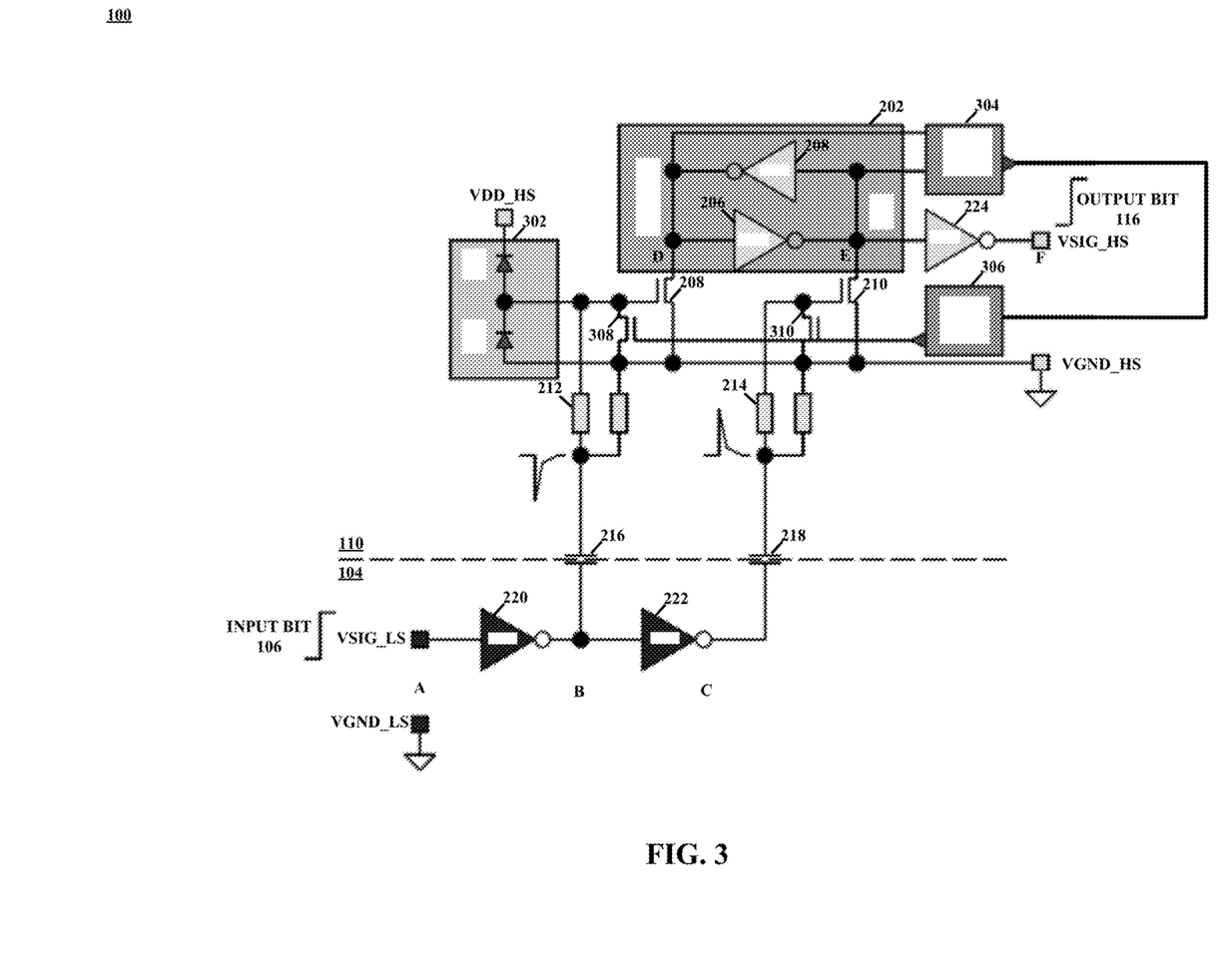
FIG. 3 shows aspects of the circuitry of FIG. 1 in second example detail.

While voltage level-shifter circuitry 100 as shown in FIG. 2 has the benefit to increase signal path reliability, a common mode error signal may be generated whereby a steep negative slope at the HV-side (rapidly falling VGND_HS and VDD_HS) can switch off both the two inputs/outputs of HV latch 202 at the same time, a forbidden condition. This common mode error signal will sometimes not be suppressed entirely by the differential HV latch 202. For example, falling edges of several tens to hundreds of volts per microsecond at the VGND_HS/VDD_HS nodes could trigger an erroneous bit-clearing (logic 1->logic 0, unintended) or bit-setting (logic 0->logic 1, unintended) at the output of level-shifter circuitry 100 (labeled node F in FIG. 2), which represents an unintended data loss. Such an unintended data loss can be disastrous in an ASIL-X application, for example, especially when it is undetected in the "back-end" circuitry of the signal chain. FIG. 3 shows aspects of level-shifter circuitry 100 of FIG. 1 in second example detail, to mitigate or prevent unintended data loss.

In particular, FIG. 3 shows level-shifter circuitry 100 of FIG. 1 with protection and reliability circuitry as realized by feedback circuitry 118. For example, in order to protect level-shifter circuitry 100 from damage due to overvoltage conditions, a clamping structure 302 may be defined across the gate terminal of transistors 208 and 210. It is contemplated that clamping structure 302 may be realized in many different ways and according to implementation-specific requirements. For example, clamping structure 302 may be realized as pn-junction diodes or MOSFETs in diode configuration, or both. More complicated overvoltage protection is though within the scope of the present disclosure.

As another example, it is contemplated that level-shifter circuitry 100 may be configured to exhibit a NOR-gate 304 (upper right side of FIG. 3) with inputs connected directly to the inputs/outputs of HV latch 202 and an output connected directly to a phase correction block 306 (active or passive). As mentioned above, a steep negative slope at the HV-side (rapidly falling VGND_HS and VDD_HS) can switch off both the two inputs/outputs of HV latch 202 at the same time, a forbidden condition. So, upon occurrence of such a steep negative slope, both inputs of NOR-gate 304 will carry logic 0 and consequently output of NOR-gate 304 will immediately carry logic 1. After passing phase correction block 306, the slope detection signal from NOR-gate 304 will trigger or turn on both transistor 308 and 310 and shown in FIG. 3.

Figure 4:
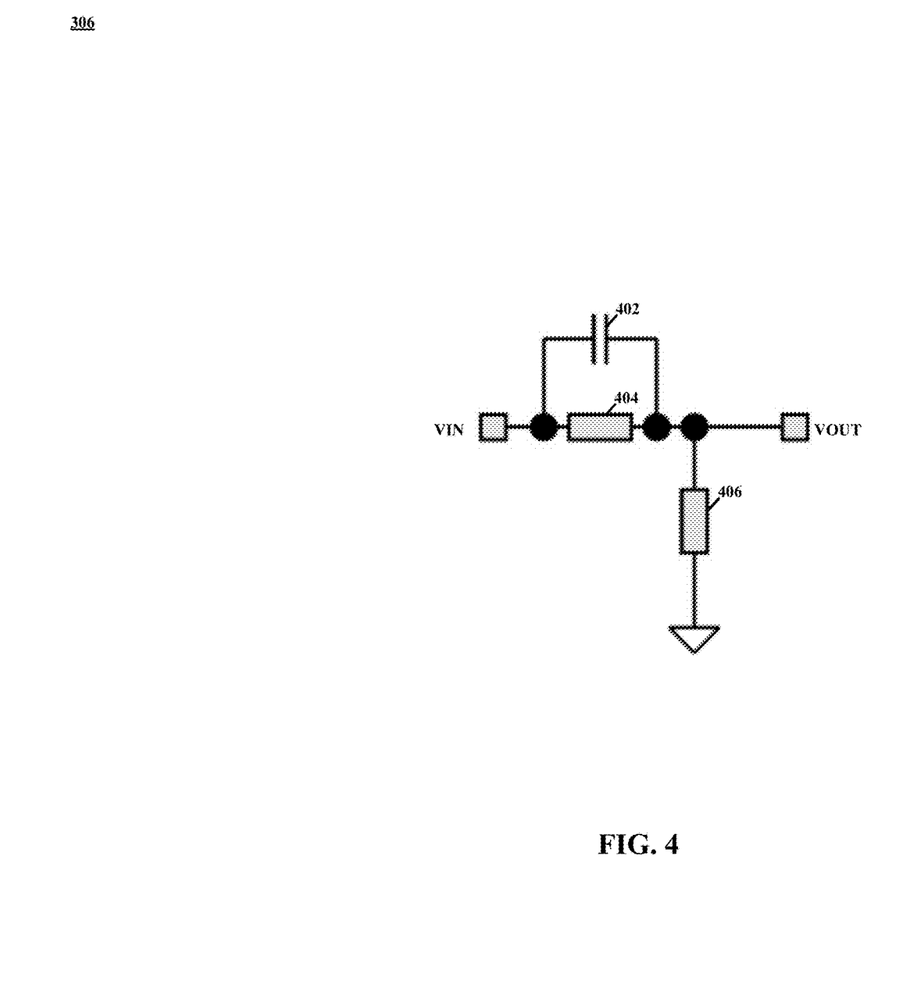
FIG. 4 shows aspects of the circuitry of FIG. 1 in third example detail.

Transistors 308 and 310 are used to "clamp" the erroneous common mode signal at the gate nodes of transistors 208 and 210 and prevent transistors 208 and 210 from passing the erroneous common mode signal to the inputs/outputs of HV latch 202. This reliability feedback mechanism as realized by feedback circuitry 118 (see FIG. 1) substantially further improves the signal integrity of level-shifter circuitry 100. With reference to FIG. 4, however, which shows aspects of level-shifter circuitry 100 of FIG. 1 in third example detail, a steep negative slope at the HV-side will activate the reliability feedback mechanism realized by NOR-gate 304, phase correction block 306 and transistors 308 and 310 and shown in FIG. 3. Due to the 3-pole character of the loop, (differential) oscillations at the two inputs/outputs of HV latch 202 may build up and last as long as the transition takes. In order to suppress these potential oscillations, phase correction block 306 may include an R/C network that comprises capacitor 502 and resistors 504 and 506 arranged in topology as shown in FIG. 4.

Figure 5:
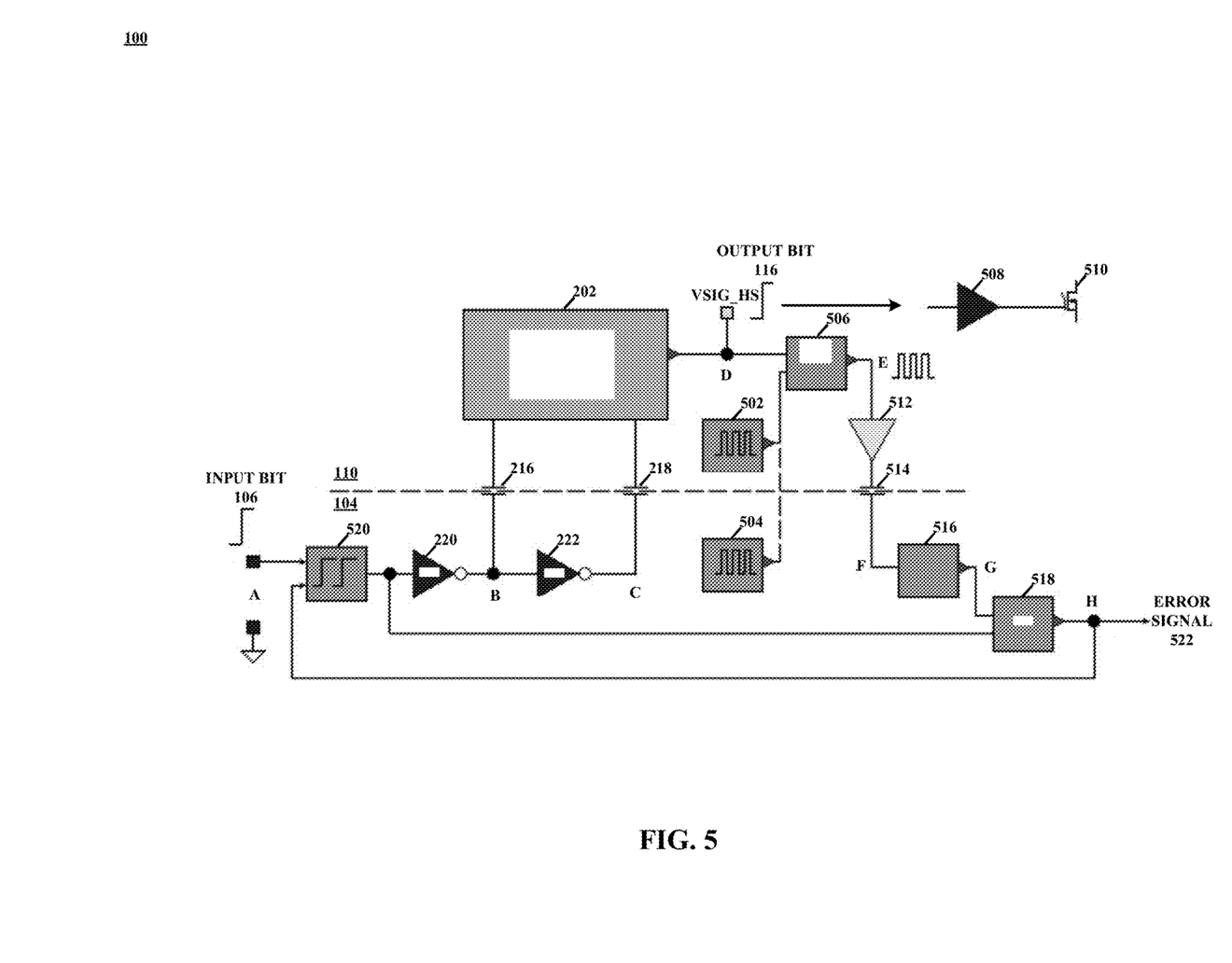
FIG. 5 shows aspects of the circuitry of FIG. 1 in fourth example detail.

But still, for ASIL-D and other highly secure applications, for example, it is contemplated that a bit error detection scheme may be implemented to further improve reliability and bit error rate at the output of level-shifter circuitry 100 as shown in FIGS. 3-4. FIG. 5 shows aspects of level-shifter circuitry 100 of FIG. 1 in fourth example detail, to further improve reliability and bit error rate at the output of level-shifter circuitry 100.

In particular, FIG. 5 shows level-shifter circuitry 100 of FIG. 1 with protection and reliability circuitry as realized by feedback circuitry 118. For example, it is contemplated that level-shifter circuitry 100 may be configured to exhibit a local (situated locally in high-voltage domain 110) oscillator circuit 502 or a global (supplied from low-voltage domain 104 to multiple different instances of high-voltage domain 110) oscillator circuit 504, that could also be a phase-locked-loop clock signal. It is contemplated that the frequency of the signal output by local oscillator circuit 502 or oscillator circuit 504, or other component, is set to enable a fast detection response, such as at several MHz.

In this example, level-shifter circuitry 100 may further be configured to exhibit an AND-gate 506 or a similar digital modulating block that "senses" the state (i.e., logic 0/1) at the output of level-shifter circuitry 100, where output bit 116 is ultimately provided as input to a high-side gate driver 508 that in turn is configured to drive a power transistor 510 as shown in FIG. 5. If output bit 116 is at logic 1, then the node (node E in FIG. 5) at the input of a buffer 512 of level-shifter circuitry 100 will carry the signal output by local oscillator circuit 502, or global oscillator circuit 504, at the programmed frequency. Otherwise, the node at the input of buffer 512 will carry a logic 0. This "modulated" signal in turn is passed through buffer 512 and down-converted to the core, low-voltage domain 104 via at least one capacitor 514 of level-shifter circuitry 100.

Next, assuming that output bit 116 is at logic 1 to continue with the example, a monoflop 516 or similar filtering device of level-shifter circuitry 100 will detect or demodulate the logic 1 and pass the signal (logic 1, or logic 0 in a different example) to the node (node G in FIG. 5) at a first input of a digital comparator 518 of level-shifter circuitry 100. It is contemplated that digital comparator 518 may be configured to receive input bit 106, at a second input, from a transition control block 520 of level-shifter circuitry 100. In this example, digital comparator 518 may output an error signal 522 if the bit at the first input of digital comparator 518 and the bit at the second input digital comparator 518 do not match (as logic 1 in this example). In such an instance, in event of a bit-mismatch, error signal 522 may trigger transition control block 520 to output a low-to-high (or high-to-low) transition in order to correct for the lost logic 1 (or logic 0) that should be stored in HV latch 202. In practice, the dead time of every high-side driver is much greater than the time that would be needed to refresh the state of output bit 116 such that no unintended or corrupt logic signal (state) can propagate to power transistor 510 as shown in FIG. 5.

It is contemplated that the features or aspects of level-shifter circuitry 100 as shown and discussed in the context of FIGS. 1-5 may be used alone or combined in any way to realize the following advantages: increased area and power efficiencies (e.g., ~0.005 µm$^2$ in 120 nm power technology, ~1 nA DC current); fast switching speeds (e.g., ~10-20 nanoseconds or better); no need for DMOS transistors that introduce parasitic elements like thyristors, diodes, and capacitances; robustness against data loss, fast switching transients, and EMI; and supports different voltage swings in the LV and HV domains.

Figure 6:
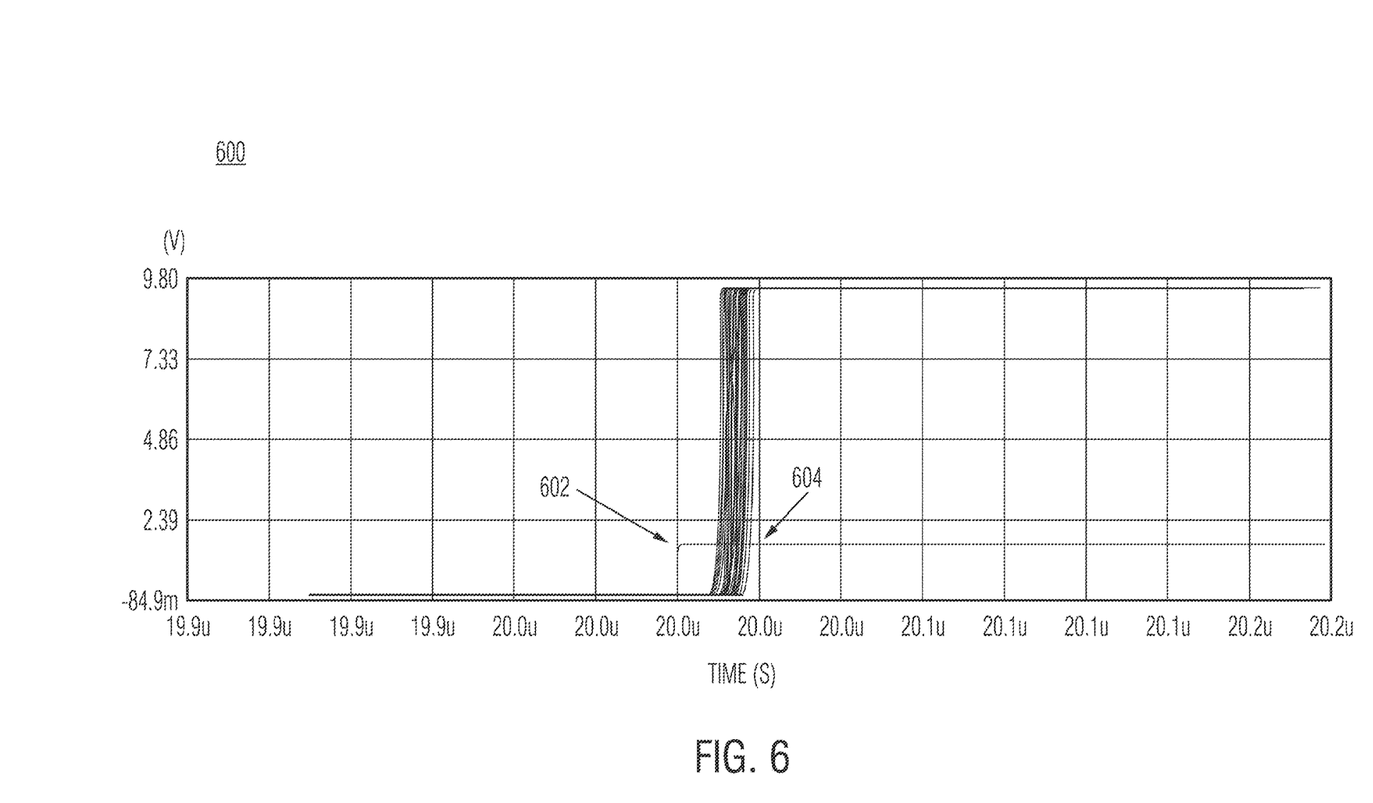
FIG. 6 shows a first signal diagram according to the disclosure.

For example, FIG. 6 shows a first signal diagram 600 according to the disclosure, whereby simulation signal 602 represents input bit 106 and simulation signal set 604 represents output bit 106 over process corners. In the simulation of FIG. 6, input bit 106 transitions from logic low to logic high and the propagation delay, which represent switching speed, for output bit 106 to make the same logic transition is on the order of 10-20 nanoseconds. Level-shifter circuitry 100 as configured and/or arranged in a manner as discussed in the context of FIGS. 1-5 confers such an advantage. Although, other similar or related architectures level-shifter are contemplated whereby the same advantage as well as the high reliability aspects of the disclosure may be realized.

Figure 7:
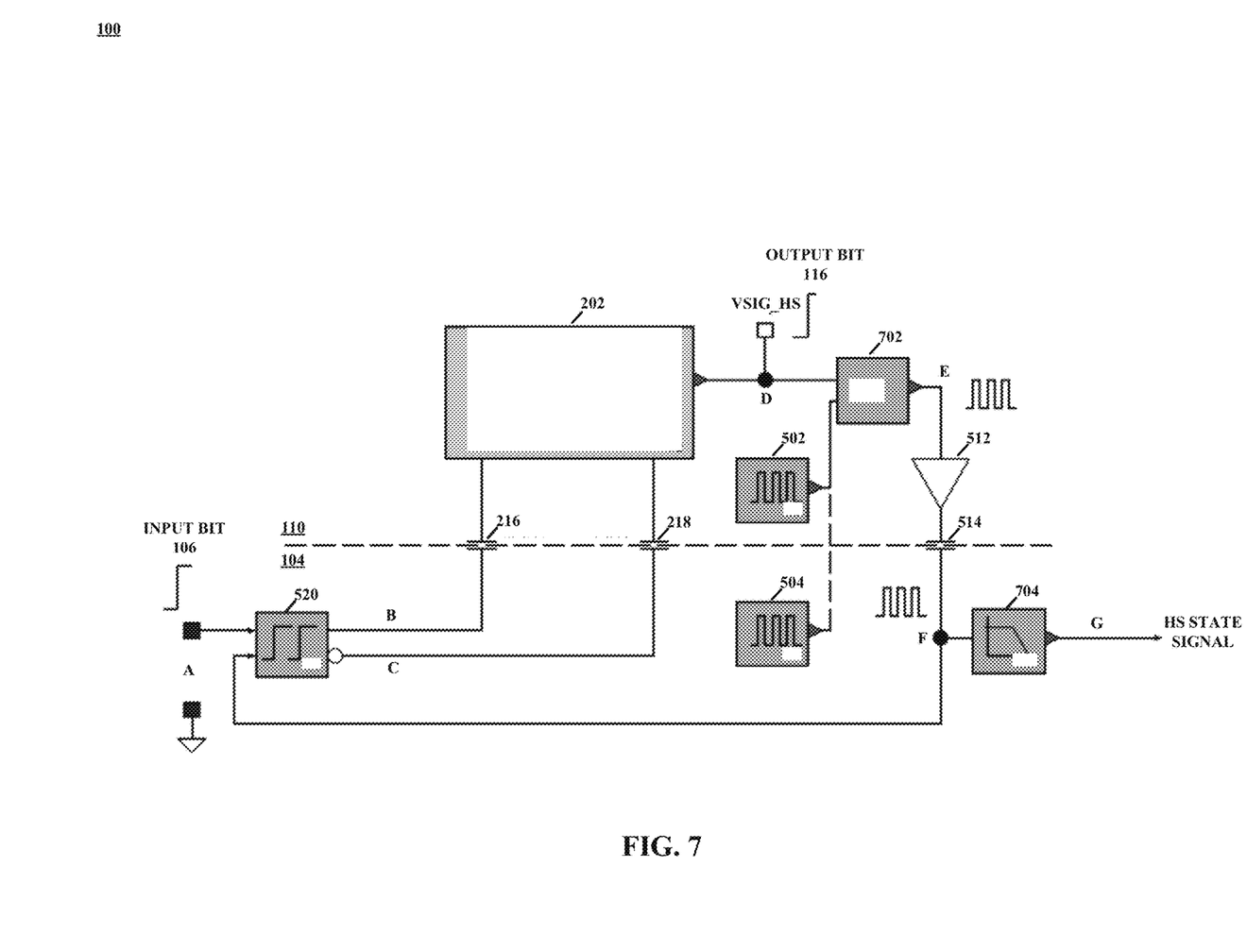
FIG. 7 shows aspects of the circuitry of FIG. 1 in fifth example detail.

For example, FIG. 7 shows aspects of the level-shifter circuitry 100 of FIG. 1 in fifth example detail. In particular, FIG. 7 shows level-shifter circuitry 100 of FIG. 1 with protection and reliability circuitry as realized by feedback circuitry 118. For example, and similar to that shown in FIG. 5, level-shifter circuitry 100 may be configured to exhibit local oscillator circuit 502, or global oscillator circuit 504, as well as buffer 512, capacitor 514 and transition control block 520. In this example, however, level-shifter circuitry 100 may be configured to exhibit a duty cycle block 702 that "senses" the state (i.e., logic 0/1) at the output of level-shifter circuitry 100. If output bit 116 is at logic 1, then the node (node F in FIG. 7) at the input of buffer 512 will carry a signal that has a "high" duty cycle. Otherwise, the node at the input of buffer 512 will carry a "low" duty cycle signal. This "modulated" signal in turn is passed through buffer 512 and down-converted to the core, low-voltage domain 104 via capacitor 514 to both transition control block 520 and a monoflop 704 or high-pass filter of level-shifter circuitry 100.

Next, assuming that output bit 116 is at logic 1, monoflop 704 will detect or demodulate the "high" duty cycle signal and pass the signal as a logic 1 (or logic 0 in a different example) to an output node (node G in FIG. 7). In event of a bit-mismatch, determined by transition control block 520 based on the "high" duty cycle signal and the state of input bit 106, transition control block 520 will output a high-to-low (or low-to-high) transition in order to correct for the lost logic 0 (or logic 1) that should be stored in HV latch 202. An example of such as response of level-shifter circuitry 100 as shown in FIG. 7 to correct a bit-mismatch is in turn shown in FIG. 8.

Figure 8:
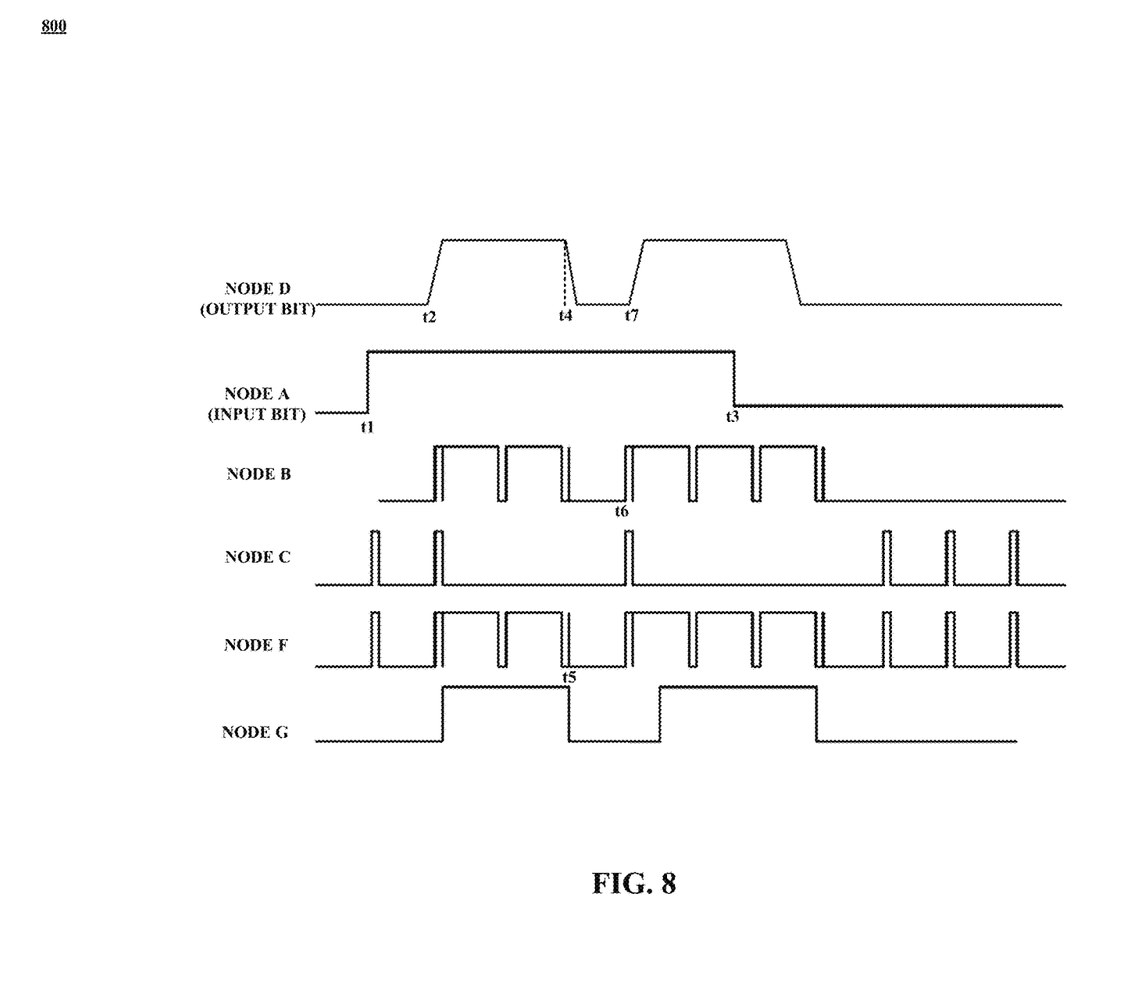
FIG. 8 shows a second signal diagram according to the disclosure.

In particular, FIG. 8 shows a second signal diagram 800 according to the disclosure, to demonstrate the high reliability aspects of the example topology shown in FIG. 7. Although, the same or similar high reliability aspects may be realized by level-shifter circuitry 100 as discussed in the context of the entirety of the disclosure. For example, at time t1 as shown in FIG. 8, input bit 106 (see signal at node A in FIGS. 7-8) undergoes a low-to-high transition. After a finite delay, output bit 116 (see signal at node D in FIGS. 7-8) undergoes the same low-to-high transition at time t2. During the period between time t2 and time t3 as shown in FIG. 8, input bit 106 remains at logic 1 although at time t4 output bit 116 inadvertently flips to logic 0, which represents a bit error event.

After another finite delay, the signal at the input of monoflop 704 (see signal at node F in FIGS. 7-8) transitions from "high" duty cycle to "low" duty cycle signal at time t5. This is the mechanism that triggers transition control block 520 to correct the bit error event in light of the topology shown in FIG. 7. Specifically, after another finite delay, the transition control block 520 (see signal at nodes B,C in FIGS. 7-9) will output a high-to-low (or low-to-high) transition at time t6 in order to correct for the lost logic 0 (or logic 1) that should be stored in HV latch 202. The logic state transition in turn is processed in high-voltage domain 110 as shown in FIG. 7 to reset output bit 116 to logic 1 at time t7 (see signal at nodes D, G in FIGS. 7-8).

One of ordinary skill in the art will understand that many benefits and advantages flow from high-voltage level-shifter circuitry 100 as configured and/or arranged in a manner as discussed in the context of FIGS. 1-8. Additionally, the following numbered examples demonstrate one or more aspects of the disclosure.

EXAMPLE 1

A voltage level-shifter circuit comprising: latch circuitry configured to store an output bit that is a level-shifted version of an input bit; and charge amplifier circuitry configured to receive as input the input bit and, in response, to drive the latch circuitry to store the output bit that is the level-shifted version of the input bit. Although not so limited, such an example implementation is consistent with that shown and described in connection with at least FIG. 1 with reference to at least latch circuitry 114 and charge amplifier circuitry 118.

EXAMPLE 2

The circuit of Example 1, wherein the charge amplifier circuitry comprises a first signal branch and a second signal branch, and wherein each one of the first signal branch and the second signal branch comprises a capacitor, a resistor and a transistor arranged in a topology to function as a charge amplifier for a corresponding one node of the latch circuitry. Although not so limited, such an example implementation is consistent with that shown and described in connection with at least FIG. 2 with reference to at least capacitors 216 and 218, resistors 212 and 214 and transistors 208 and 210.

EXAMPLE 3

The circuit of any one of Examples 1-2, further comprising: overvoltage protection circuitry configured to protect the voltage level-shifter circuit from excess voltage. Although not so limited, such an example implementation is consistent with that shown and described in connection with at least FIG. 3 with reference to at least clamping structure 302.

EXAMPLE 4

The circuit of any one of Examples 1-3, further comprising: common mode rejection circuitry configured to suppress propagation of a common mode error signal to the latch circuitry. Although not so limited, such an example implementation is consistent with that shown and described in connection with at least FIG. 3 with reference to at least NOR-gate 304, phase correction block 306 and transistors 308 and 310.

EXAMPLE 5

The circuit of any one of Examples 1-4, further comprising: bit-mismatch corrective circuitry configured to enforce the output bit to a value that corresponds to the level-shifted version of the output bit. Although not so limited, such an example implementation is consistent with that shown and described in connection with at least FIG. 5 with reference to at least transition control block 520.

EXAMPLE 6

The circuit of any one of Examples 1-5, further comprising: phase correction circuitry configured to dampen oscillations at nodes of the latch circuitry. Although not so limited, such an example implementation is consistent with that shown and described in connection with at least FIG. 3 with reference to at least phase correction block 306.

EXAMPLE 7

A voltage level-shifter circuit comprising: low-voltage domain circuitry that is configured to generate voltage input signals with reference to a low-voltage domain ground node; and high-voltage domain circuitry that is capacitively coupled to the low-voltage domain circuitry and that is configured to generate voltage output signals, with reference to a high-voltage domain common node, that correspond to a level-shifted version of the voltage input signals; wherein the high-voltage domain circuitry comprises charge amplifier circuitry and latch circuitry, and wherein the charge amplifier circuitry is configured to receive as input the voltage input signals and to drive the latch circuitry to generate the voltage output signals.

EXAMPLE 8

The circuit of Example 7, wherein the charge amplifier circuitry comprises: a first capacitor that is coupled to an output of a first inverter of the low-voltage domain circuitry, and a second capacitor that is coupled to an output of a second inverter of the low-voltage domain circuitry, to capacitively couple the high-voltage domain circuitry to the low-voltage domain circuitry; a first transistor that includes a control terminal that is coupled to the first capacitor and a first terminal of a first resistor, a source/drain terminal that is coupled to a first node of the latch circuitry, and a drain/source terminal that is coupled to a second terminal of the first resistor and the high-voltage domain common node; and a second transistor that includes a control terminal that is coupled to the second capacitor and a first terminal of a second resistor, a source/drain terminal that is coupled to a second node of the latch circuitry, and a drain/source terminal that is coupled to a second terminal of the second resistor and the high-voltage domain common node.

EXAMPLE 9

The circuit of any one of Examples 7-8, further comprising: overvoltage protection circuitry that is configured to protect the voltage level-shifter circuit from excess voltage, wherein the overvoltage protection circuitry comprises first clamp circuitry that is coupled to a control terminal of a first transistor of the charge amplifier circuitry and that is configured to limit magnitude of voltage at the control terminal of the first transistor, and second clamp circuitry that is coupled to a control terminal of a second transistor of the charge amplifier circuitry and that is configured to limit magnitude of voltage at the control terminal of the second transistor.

EXAMPLE 10

The circuit of any one of Examples 7-9, further comprising: common mode rejection circuitry configured to suppress propagation of a common mode error signal to the latch circuitry, wherein the overvoltage protection circuitry comprises first clamp circuitry that is coupled to a control terminal of a first transistor of the charge amplifier circuitry and that is configured to pull the control terminal of the first transistor to a voltage potential of the high-voltage domain common node, and second clamp circuitry that is coupled to a control terminal of a second transistor of the charge amplifier circuitry and that is configured to pull the control terminal of the second transistor to the voltage potential of the high-voltage domain common node.

EXAMPLE 11

The circuit of any one of Examples 7-10, further comprising: bit-mismatch corrective circuitry configured to enforce the voltage output signals to a value that corresponds to the level-shifted version of the voltage input signals, wherein the bit-mismatch corrective circuitry comprises: sampling circuitry configured to sample the voltage output signals; clock circuitry configured to control the sampling circuit to sample the voltage output signals at a particular rate; and comparator circuitry configured to compare an instant logic level of the voltage input signals with a sampled logic level of the voltage output signals, and to output a bit-correction signal to the low-voltage domain circuitry that is coupled into the high-voltage domain circuitry to enforce the voltage output signals to the value that corresponds to the level-shifted version of the voltage input signals.

EXAMPLE 12

The circuit of any one of Examples 7-11, further comprising: phase correction circuitry configured to dampen oscillations at nodes of the latch circuitry, wherein the phase correction circuitry comprises a resistor-capacitor network that is coupled between an output of the latch circuitry and inputs of the overvoltage protection circuitry.

EXAMPLE 13

The circuit of any one of Examples 7-12, wherein the low-voltage domain circuitry comprises a first inverter that is coupled in series with a second inverter, and wherein the first inverter and the second inverter are configured to generate the voltage input signals.

EXAMPLE 14

The circuit of any one of Examples 7-13, wherein the latch circuitry comprises a first latch inverter and a second latch inverter, wherein an output of the first latch inverter is coupled to an input of the second latch inverter at a first node of the latch circuitry, and an output of the second latch inverter is coupled to an input of the first latch inverter at a second node of the latch circuitry.

EXAMPLE 15

The circuit of any one of Examples 7-14, further comprising: buffer circuitry that is coupled at an input terminal to a node of the latch circuitry and that is configured to generate at an output terminal the voltage output signals with reference to the high-voltage domain common node.

EXAMPLE 16

A method comprising: by charge amplifier circuitry of a voltage level-shifter circuit, receiving as input an input bit from low-voltage domain circuitry of the voltage level-shifter circuit and, in response, driving latch circuitry of the voltage level-shifter circuit to store an output bit that is a level-shifted version of the input bit.

EXAMPLE 17

The method of Example 16, further comprising: by overvoltage protection circuitry of the voltage level-shifter circuit, preventing the voltage level-shifter circuit from exposure to excess voltage.

EXAMPLE 18

The method of any one of Examples 16-17, further comprising: by common mode rejection circuitry of the voltage level-shifter circuit, suppressing propagation of a common mode error signal to the latch circuitry.

EXAMPLE 19

The method of any one of Examples 16-18, further comprising: by bit-mismatch corrective circuitry of the voltage level-shifter circuit, enforcing the output bit to a value that corresponds to the level-shifted version of the output bit.

EXAMPLE 20

The method of any one of Examples 16-19, further comprising: by phase correction circuitry of the voltage level-shifter circuit, dampening oscillations at nodes of the latch circuitry.

EXAMPLE 21

A voltage level-shifter circuit comprising: low-voltage domain circuitry that is configured to generate voltage input signals with reference to a low-voltage domain ground node: high-voltage domain circuitry that is capacitively coupled to the low-voltage domain circuitry and that is configured to generate voltage output signals, with reference to a high-voltage domain common node, that correspond to a level-shifted version of the voltage input signals; and correction control circuitry that is coupled in a feedback loop between the low-voltage domain circuitry and the high-voltage domain circuitry; wherein the high-voltage domain circuitry comprises charge amplifier circuitry that is configured to receive as input the voltage input signals and to drive the latch circuitry to generate the voltage output signals based on the voltage input signals, and wherein the correction control circuitry is configured to receive as input the voltage output signals and to drive the low-voltage domain circuitry to generate the voltage input signals based on the voltage output signals.

EXAMPLE 22

The circuit of Example 21, wherein the charge amplifier circuitry comprises a first signal branch and a second signal branch, and wherein each one of the first signal branch and the second signal branch comprises a capacitor, a resistor and a transistor arranged in a topology to function as a charge amplifier for a corresponding one node of the latch circuitry.

EXAMPLE 23

The circuit of any one of Examples 21-22, wherein the capacitor and the resistor of each one of the first signal branch and the second signal are arranged in a topology to function as a high pass filter.

EXAMPLE 24

A voltage level-shifter circuit comprising: latch circuitry configured to store an output bit that is a level-shifted version of an input bit; and feedback circuitry configured to restore the output bit to the level-shifted version of the input bit responsive to logic state change in the output bit absent logic state change in the input bit. Although not so limited, such an example implementation is consistent with that shown and described in connection with at least FIG. 1 with reference to at least latch circuitry 114 and feedback circuitry 118.

EXAMPLE 25

The circuit of Example 24, wherein the feedback circuitry comprises oscillator circuitry that is configured to operate in a low-voltage domain of the voltage level-shifter circuit while the latch circuitry is configured to operate in a high-voltage domain of the voltage level-shifter circuit, and wherein the oscillator circuitry is configured to output a signal at a frequency that represents resolution for the feedback circuitry to monitor logic state of the output bit and input bit. Although not so limited, such an example implementation is consistent with that shown and described in connection with at least FIG. 5 with reference to at least oscillator circuitry 504.

EXAMPLE 26

The circuit of any one of Examples 24-25, wherein the feedback circuitry comprises oscillator circuitry that is configured to operate in a high-voltage domain of the voltage level-shifter circuit while the latch circuitry is configured to operate in the high-voltage domain of the voltage level-shifter circuit, and wherein the oscillator circuitry is configured to output a signal at a frequency that represents resolution for the feedback circuitry to monitor logic state of the output bit and input bit. Although not so limited, such an example implementation is consistent with that shown and described in connection with at least FIG. 5 with reference to at least oscillator circuitry 502.

EXAMPLE 27

The circuit of any one of Examples 24-26, wherein the feedback circuitry is configured to monitor logic state of the input bit and the output bit at a frequency that is a function of an oscillator clock signal. Although not so limited, such an example implementation is consistent with that shown and described in connection with at least FIG. 5 with reference to at least oscillator circuitry 502 and oscillator circuitry 504.

EXAMPLE 28

The circuit of any one of Examples 24-27, wherein the feedback circuitry is configured to determine a mismatch between logic state of the input bit and logic state of the output bit and control the latch circuitry to store the output bit that is the level-shifted version of the input bit. Although not so limited, such an example implementation is consistent with that shown and described in connection with at least FIG. 7 with reference to at least transition control block 520.

EXAMPLE 29

The circuit of any one of Examples 24-28, further comprising charge amplifier circuitry configured to receive as input the input bit and, in response, to drive the latch circuitry to store the output bit that is the level-shifted version of the input bit. Although not so limited, such an example implementation is consistent with that shown and described in connection with at least FIG. 1 with reference to at least charge amplifier circuitry 118.

Various examples of the disclosure have been described. Any combination of the described systems, operations, or functions is contemplated. These and other examples are within the scope of the following claims.

What is claimed is:

1. A voltage level-shifter circuit comprising:
   low-voltage domain circuitry configured to generate a voltage input signal with reference to a low-voltage domain ground node;
   high-voltage domain circuitry capacitively coupled to the low-voltage domain circuitry and configured to generate a voltage output signal, with reference to a high-voltage domain common node, that corresponds to a level-shifted version of the voltage input signal;
   wherein the high-voltage domain circuitry comprises charge amplifier circuitry, latch circuitry, and feedback circuitry,
   wherein the charge amplifier circuitry is configured to receive as input the voltage input signal and to drive the latch circuitry to generate the voltage output signal,
   wherein the feedback circuitry is configured to generate a slope detection signal in response to an erroneous condition at the latch circuitry, and
   wherein the voltage level-shifter circuit further comprises common mode rejection circuitry configured to suppress propagation of a common mode error signal to the latch circuitry, wherein the common mode rejection circuitry comprises first clamp circuitry coupled to a control terminal of a first transistor of the charge amplifier circuitry and configured to pull the control terminal of the first transistor to a voltage potential of the high-voltage domain common node in response to the slope detection signal, and second clamp circuitry coupled to a control terminal of a second transistor of the charge amplifier circuitry and configured to pull the control terminal of the second transistor to the voltage potential of the high-voltage domain common node in response to the slope detection signal.

2. The voltage level-shifter circuit of claim 1, wherein the charge amplifier circuitry comprises:
   a first capacitor coupled to an output of a first inverter of the low-voltage domain circuitry,
   a second capacitor coupled to an output of a second inverter of the low-voltage domain circuitry and configured to capacitively couple the high-voltage domain circuitry to the low-voltage domain circuitry;
   a first transistor including a control terminal coupled to the first capacitor and a first terminal of a first resistor, a source/drain terminal coupled to a first node of the latch circuitry, and a drain/source terminal coupled to a second terminal of the first resistor and the high-voltage domain common node; and
   a second transistor including a control terminal coupled to the second capacitor and a first terminal of a second resistor, a source/drain terminal coupled to a second node of the latch circuitry, and a drain/source terminal coupled to a second terminal of the second resistor and the high-voltage domain common node.

3. The voltage-level shifter circuit of claim 1, further comprising:
   overvoltage protection circuitry configured to protect the voltage level-shifter circuit from excess voltage.

4. A voltage level-shifter circuit comprising:
   low-voltage domain circuitry configured to generate a voltage input signal with reference to a low-voltage domain ground node;
   high-voltage domain circuitry capacitively coupled to the low-voltage domain circuitry and configured to generate a voltage output signal, with reference to a high-voltage domain common node, that corresponds to a level-shifted version of the voltage input signal;
   wherein the high-voltage domain circuitry comprises charge amplifier circuitry and latch circuitry,
   wherein the charge amplifier circuitry is configured to receive as input the voltage input signal and to drive the latch circuitry to generate the voltage output signal; and
   wherein the voltage level-shifter circuit further comprises bit-mismatch corrective circuitry configured to enforce the voltage output signal to a value that corresponds to the level-shifted version of the voltage input signal, wherein the bit-mismatch corrective circuitry comprises:
   sampling circuitry configured to sample the voltage output signal;
   clock circuitry configured to control the sampling circuit to sample the voltage output signal at a particular rate; and
   comparator circuitry configured to compare an instant logic level of the voltage input signal with a sampled logic level of the voltage output signal, and to output a bit-correction signal to the low-voltage domain circuitry to enforce the voltage output signal to the value that corresponds to the level-shifted version of the voltage input signal.

5. A voltage level-shifter circuit comprising:
   low-voltage domain circuitry configured to generate a voltage input signal with reference to a low-voltage domain ground node;
   high-voltage domain circuitry capacitively coupled to the low-voltage domain circuitry and configured to generate a voltage output signal, with reference to a high-voltage domain common node, that corresponds to a level-shifted version of the voltage input signal;

wherein the high-voltage domain circuitry comprises charge amplifier circuitry and latch circuitry, wherein the charge amplifier circuitry is configured to receive as input the voltage input signal and to drive the latch circuitry to generate the voltage output signal; and wherein the voltage level-shifter circuit further comprises phase correction circuitry configured to dampen oscillations at nodes of the latch circuitry and overvoltage protection circuitry configured to protect the voltage level-shifter circuit from excess voltage, wherein the phase correction circuitry comprises a resistor-capacitor network coupled between an output of the latch circuitry and inputs of the overvoltage protection circuitry.

6. The voltage level-shifter circuit of claim 1, wherein the low-voltage domain circuitry comprises a first inverter coupled in series with a second inverter, and wherein the first inverter and the second inverter are configured to generate the voltage input signal.

7. The voltage level-shifter circuit of claim 1, wherein the latch circuitry comprises a first latch inverter and a second latch inverter, wherein an output of the first latch inverter is coupled to an input of the second latch inverter at a first node of the latch circuitry, and an output of the second latch inverter is coupled to an input of the first latch inverter at a second node of the latch circuitry.

8. The voltage level-shifter circuit of claim 1, further comprising:

buffer circuitry coupled at an input terminal to a node of the latch circuitry and configured to generate at an output terminal the voltage output signal with reference to the high-voltage domain common node.

\* \* \* \* \*